United States Patent [19]

Hauquier et al.

[11] Patent Number: 5,445,912

[45] Date of Patent: Aug. 29, 1995

[54] LITHOGRAPHIC BASE AND A METHOD FOR MAKING A LITHOGRAPHIC PRINTING PLATE THEREWITH

[75] Inventors: Guido Hauquier, Nijlen; Willem Cortens, Booischot; Paul Coppens, Turnhout; Joan Vermeersch, Deinze; Erik Mostaert, Boechout; Eric Verschueren, Merksplas, all of Belgium

[73] Assignee: AGFA-Gevaert, N.V., Mortsel, Belgium

[21] Appl. No.: 207,712

[22] Filed: Mar. 9, 1994

[30] Foreign Application Priority Data

Apr. 5, 1993 [EP] European Pat. Off. ........... 93200968

[51] Int. Cl.⁶ ..................... G03C 1/93; G03F 7/016
[52] U.S. Cl. ..................... 430/159; 430/157; 430/175; 430/176; 430/204; 430/272; 430/302; 430/320; 428/341; 428/448; 428/451; 428/520; 101/456; 101/457; 101/462

[58] Field of Search ............... 430/159, 272, 157, 175, 430/176, 205, 204, 320, 302; 101/455, 456, 457, 460, 462; 425/331, 451, 448, 447, 341, 511, 512, 513, 522, 520

[56] References Cited

U.S. PATENT DOCUMENTS

| 3,055,295 | 9/1962 | Perkins ........................... 101/462 |
| 3,161,519 | 12/1964 | Alsup ................................ 96/85 |
| 3,520,242 | 7/1970 | Kemp et al. ..................... 430/161 |
| 3,736,872 | 6/1973 | Martens et al. ................. 420/302 |
| 4,970,133 | 11/1990 | Vermeersch et al. ........... 430/302 |
| 5,244,728 | 9/1993 | Bowman et al. ................. 428/331 |

*Primary Examiner*—John S. Y. Chu
*Attorney, Agent, or Firm*—Breiner & Breiner

[57] ABSTRACT

The present invention provides a lithographic base comprising on a hydrophobic support a subbing layer contiguous to a hydrophilic layer containing a hydrophilic (co)polymer or (co)polymer mixture and being hardened with a hydrolyzed tetraalkyl orthosilicate crosslinking agent characterized in that said subbing layer contains a hydrophilic binder and silica and is applied at a solids content of more than 200 mg per m² but less than 750 mg per m².

10 Claims, No Drawings

LITHOGRAPHIC BASE AND A METHOD FOR MAKING A LITHOGRAPHIC PRINTING PLATE THEREWITH

FIELD OF THE INVENTION

The present invention relates to a lithographic base. More particularly the present invention relates to an improved adhesion of the hydrophilic lithographic surface layer to the support of the lithographic base.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas, generally hydrophobic areas, and the ink-rejecting areas form the background areas, generally hydrophilic areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a lithographic base that has affinity to water or obtains such affinity by chemical treatment is coated with a thin layer of a photosensitive composition. Compositions for that purpose include light-sensitive materials such as light-sensitive polymers, diazonium salts or resins, a photoconductive layer, a silver halide emulsion etc. These materials are then imagewise exposed to actinic radiation and processed in the appropriate manner so as to obtain a lithographic printing plate.

In another embodiment, a silver precipitating. (nucleating) agent is located in or on top of the hydrophylic surface. An image is obtained on the precipitating layer according to the silver salt diffusion transfer process by contacting said precipitating layer with an exposed silver halide emulsion in the presence of a silver halide developing agent and a silver halide solvent.

Several types of supports can be used for the manufacturing of a lithographic imaging printing plate. Common supports are for example organic resin supports, e.g. polyesters, and paper bases, e.g. polyolefin coated paper. These supports, if not sufficient hydrophilic by themselves, are first coated with a hydrophilic layer forming the hydrophilic lithographic background of the printing plate.

It is known to use as hydrophilic layer in these systems a layer containing polyvinyl alcohol and hydrolyzed tetra(m) ethyl orthosilicate and preferably also silicium dioxide and/or titanium dioxide as described in e.g. GB-P-1419512, FR-P-2300354, U.S. Pat. Nos. 3,971,660 and 4,284,705, EP-A-405016 and 450199 and U.S. Ser. No. 07/881,718.

In the use of such lithographic printing plates, an oleophilic (ink receptive) image is present on a hydrophilic background. In printing, the printing plate is continuously wetted with water and ink. The water is selectively taken up by the hydrophilic areas, the ink by the oleophilic areas of the printing surface. During the printing process, there occurs abrasion of the hydrophilic layer due to poor adhesion of this layer to the support either point by point or over the whole surface. The adhesion of the hydrophilic layer to the support is adversely influenced by a higher water adsorption and thus a less rigid hydrophilic layer. Due to said abrasion the hydrophobic support comes to the surface. This leads to ink acceptance in the non-printing areas, causing staining of the plate.

SUMMARY OF THE INVENTION

It is an object of the present invention to provide a lithographic base having on a support a hydrophilic layer of which the adhesion to the support is improved.

Further objects of the present invention will become clear from the description hereinafter.

According to the present invention there is provided a lithographic base comprising on a hydrophobic support a subbing layer contiguous to a hydrophilic layer containing a hydrophilic (co)polymer or (co)polymer mixture and being hardened with a hydrolysed tetraalkyl orthosilicate crosslinking agent characterized in that said subbing layer contains a hydrophilic binder and silica and is applied at a solids content of less than 750 mg per $m^2$ but preferably more than 200 mg per $m^2$.

According to the present invention there is provided a method for obtaining a lithographic printing plate comprising the step(s) of making the above mentioned lithographic base imagewise receptive to oily or greasy inks.

DETAILED DESCRIPTION OF THE PRESENT INVENTION

As hydrophilic binder in the subbing layer for the lithographic base in connection with the present invention usually a protein, preferably gelatin may be used. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

A preferred silica in the subbing layer for the lithographic base in connection with the present invention is a siliciumdioxide of the anionic type. The colloidal silica has a surface area of preferably at least 300 $m^2$ per gram, more preferably a surface area of 500 $m^2$ per gram.

The surface area of the colloidal silica is determined according to the BET-value method described by S. Brunauer, P. H. Emmett and E. Teller, J.Amer. Chem. Soc. 60, 309–312 (1938).

The silica dispersion may also contains other substances, e.g. aluminium salts, stabilising agents, biocides etc.

Such types of silica are sold under the name KIESELSOL 300 and KIESELSOL 500 (KIESELSOL is a registered trade name of Farbenfabriken Bayer AG, Leverkusen, West-Germany whereby the number indicates the surface area in $m^2$ per gram).

The weight ratio of the hydrophilic binder to silica is preferably less than 1. The lower limit is not very important but is preferably at least 0.2. The weight ratio of the hydrophilic binder to silica is more preferably between 0.25 and 0.5.

The solids content of the subbing layer for the lithographic base in connection with the present invention is less than 750 mg per m² but preferably more than 200 mg per m², more preferably between 250 mg per m² and 500 mg per m².

The coating of the above defined subbing layer composition may proceed from an aqueous colloidal dispersion optionally in the presence of a surface-active agent.

As hydrophilic (co)polymers in the hydrophilic layer of the lithographic base in connection with the present invention one may use, for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is the same as or higher than the hydrophilicity of polyvinyl acetate hydrolyzed to at least an extent of 60 percent by weight, preferably 80 percent by weight. Most preferably polyvinyl alcohol is used in the hydrophilic layer in connection with the present invention.

Examples of tetraalkyl orthosilicate crosslinking agents are hydrolyzed tetraethyl orthosilicate and hydrolyzed tetramethyl orthosilicate. The amount of tetraalkyl orthosilicate crosslinking agent is at least 0.2 parts by weight per part by weight of hydrophilic (co)polymer, preferably between 0.5 and 5 parts by weight, preferably 1.5 part by weight.

The hydrophilic layer of the lithographic base preferably also contains substances that increase the mechanical strength and the porosity of the layer. For this purpose colloidal silica may be used. The colloidal silica employed may be in the form of any commercially available water-dispersion of colloidal silica for example having an average particle size upto 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the layer is given a uniform rough texture consisting of microscopic hills and valleys, which serve as storage places for water in background areas.

More details about suitable hydrophilic layers for use in connection with the present invention can be found in e.g. GB-P-1419512, FR-P-2300354, U.S. Pat. Nos. 3,971,660, 4,284,705, EP-A-405016, EP-A-450199 and U.S. Ser. No. 07/881,718.

Various supports may be used in the lithographic base in connection with the present invention. Examples of such supports are organic resin supports e.g. polyethylene terephthalate film, cellulose acetate film, and polyolefin (e.g. polyethylene) coated paper. The support may be coated with a first subbing layer (a primer) containing e.g. a latex of copoly(vinylidenechloride/-methyl methacrylate/icatonic acid) and silica to improve the adhesion of the subbing layer contiguous to the hydrophilic layer to the support.

In a first method to obtain a lithographic plate the hydrophilic lithographic base in accordance with the present invention may be coated with a thin layer of a heat- or photosensitive composition. The heat- or photosensitive composition can also be present partially or completely in the hydrophilic layer used in accordance with the present invention. Compositions for that purpose include heat- or light-sensitive substances such as heat- or light-sensitive polymers, diazonium salts or resins, quinonediazides, photoconductive layers, silver halide emulsions etc. These materials are then imagewise exposed to actinic radiation and processed in the appropriate manner so as to obtain a lithographic printing plate.

According to one embodiment of the present invention an imaging element is prepared by applying a layer comprising a photopolymerizable composition and a silver halide emulsion layer to the lithographic base of the present invention. After imagewise exposure of the silver halide emulsion layer and subsequent development a silver image is obtained. The thus obtained silver image is subsequently employed as a mask for the photopolymerizable composition during an overall exposure of the imaging element. Finally the silver image and the non-exposed photopolymerizable composition are removed so that a lithographic printing plate is obtained.

According to another embodiment of the present invention an imaging element is prepared by applying a layer comprising a o-naphthoquinonediazide compound and an alkali soluble resin to the lithographic base of the present invention. After imagewise exposure of the photosensitive element and subsequent development a lithographic printing plate is obtained.

More details about suitable o-naphthoquinonediazide containing lithographic compositions for use in connection with the present invention can be found in e.g. EP-A-345016 and EP-A-508268.

According to still another embodiment of the present invention a lithographic printing plate is produced by the following steps: (i) uniformly electrostatically charging a photoconductive layer, such as a coating of zinc oxide photoconductive pigment dispersed in the hydrophilic layer of the present invention by means of a corona-discharge, (ii) image-wise discharging said photoconductive layer by exposing it to electromagnetic radiation to which it is sensitive, (iii) applying electrostatically charged oleophilic toner particles to develop the resulting electrostatic charge pattern and (iv) fixing the toner to the photoconductive layer. Fixing is usually accomplished by the use of heat, which causes the toner resin powder to coalesce and adhere to the photoconductive layer.

More details about suitable electrophotographic lithographic compositions for use in connection with the present invention can be found in e.g. U.S. Pat. No. 2,993,787.

In a preferred embodiment there is provided a heat recording material comprising the hydrophilic lithographic base of the present invention containing in homogeneously distributed state throughout the entire layer hydrophobic thermoplastic polymer particles having a softening or melting temperature of more than 30° C. and that are capable of coagulating when brought above their softening or melting temperature, forming a hydrophobic agglomerate in the hydrophilic layer so that at these parts the hydrophilic layer becomes sufficiently hydrophobic to accept a greasy ink in lithographic printing wherein a dampening liquid is used.

Specific examples of hydrophobic polymer particles for use in connection with the present invention are e.g.

polyethylene, polyvinyl chloride, polymethyl(meth)acrylate, polyethyl (meth) acrylate, polyvinylidene chloride, polyacrylonitrile, polyvinyl carbazole etc. or copolymers thereof. Most preferably used is polyethylene.

The molecular weight of the polymers may range from 5,000 to 1,000,000.

The hydrophobic particles may have a particle size from 0.01 $\mu$m to 50 $\mu$m, more preferably between 0.05 $\mu$m and 10 $\mu$m and most preferably between 0.05 $\mu$m and 2 $\mu$m. The larger the polymer particles are the less the resolving power of the heat recording material will be.

The polymer particles are present as a dispersion in the aqueous coating liquid and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

The amount of hydrophobic thermoplastic polymer particles contained in the hydrophilic layer is preferably between 20% by weight and 65% by weight and more preferably between 25% by weight and 55% by weight and most preferably between 30% by weight and 45% by weight. When too low amounts are used the hydrophobicity produced at the exposed areas may be too small and as a consequence ink acceptance will be poor in these areas whereas too large amounts of the hydrophobic thermoplastic polymer particles may result in ink acceptance in the non-image areas due to a too large overall hydrophobicity of the hydrophilic layer.

The above described heat recording material can be exposed by actinic radiation while in contact with an original that contains a pattern of areas that are capable of converting the radiation into heat at these areas so that the hydrophobic thermoplastic polymer particles in the hydrophilic layer are softened or melted and coagulate in the exposed areas thereby increasing the hydrobicity of the hydrophilic layer at these areas.

An especially suitable radiation is e.g. infrared or near infrared radiation. As an original there may be used e.g. an imaged silver halide photographic material.

More details in connection with this embodiment can be found in e.g. U.S. Pat. No. 3,476,937 and U.S. Pat. No. 3,971,660.

In a further preferred embodiment there is provided a light-sensitive material comprising a diazonium salt or resin, contained in homogeneously distributed state throughout or preferably coated from a hydrophilic solution over the hydrophilic lithographic base of the present invention.

Examples of low-molecular weight diazonium salt for use in the present invention include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde.

Examples of diazo resins useful in the present invention include condensation products of an aromatic diazonium salt as the light-sensitive substance. Such condensation products are known and are described, for example, in DE-P-1214086. They are in general prepared by condensation of a polynuclear aromatic diazonium compound, preferably of substituted or unsubstituted diphenylamine-4-diazonium salts, with active carbonyl compounds, preferably formaldehyde, in a strongly acid medium.

Said light-sensitive layer preferably also contains a binder e.g. polyvinyl alcohol and may be applied to the lithographic base in a thickness of 0.2 $\mu$m to 5 $\mu$m. Said presensitized imaging element advantageously contains water-soluble dyes such as rhodamines, sudan blue, methylene blue, eosin or triphenylmethane dyes such as crystal violet, victoria pure blue, malachite green, methylviolet and fuchsin or dye pigments which are essentially water insoluble. Said dyes and/or dye pigments may be present in any layer comprised on the support of said presensitized imaging element but are preferably present in said hydrophilic layer and/or light-sensitive layer.

Exposure of the presensitized imaging element advantageously proceeds with ultraviolet light optionally in combination with blue light in the wavelength range of 250 to 500 nm. Useful exposure sources are high or medium pressure halogen mercury vapour lamps, e.g. of 1000 W. Since most lithography is done by the offset process, the imaging element is exposed in such a way that the image obtained thereon is right reading. The exposure may be an exposure using optics or a contact exposure.

The diazo resin or diazonium salts are converted upon exposure from water soluble to water insoluble (due to the destruction of the diazonium groups) and additionally the photolysis products of the diazo may induce an advancement in the level of crosslinking of the polymeric binder or diazo resin, thereby selectively converting the surface, in an image pattern, from water soluble to water insoluble. The unexposed areas remain unchanged, i.e. water soluble.

When mounted on a printing press the printing plate is first washed with an aqueous fountain solution. To prevent this fountain solution from being contaminated by residual non-exposed diazo the unexposed diazo resin or diazonium salt should be removed from the printing plate before mounting it on a printing press. This removal can be achieved by rinsing or washing the imaging element with water or an aqueous solution.

More details in connection with this embodiment can be found in e.g. FR-P-2300354, U.S. Pat. No. 4,284,705 and EP-A-92203835.1.

In another method to obtain a lithographic plate the hydrophilic. lithographic base in accordance with the present invention is used as an image-receiving element for a heat- or photosensitive composition.

In one embodiment the lithographic base in accordance with the present invention may be used as a receiving element in a thermal transfer process where a hydrophobic substance or composition is informationwise transferred from a donor element to said lithographic base. Such a process is described in e.g. U.S. Pat. Nos. 3,060,024, 3,085,488, 3,649,268 and EP-A-502,562.

According to a preferred embodiment of the present invention a toner image may be transferred to the lithographic base of the present invention during an electrophotographic process as disclosed in e.g. U.S. Pat. No. 3,971,660 and EP-A-405,016.

According to the most preferred embodiment of the present invention a layer of physical development nuclei may be applied to the lithographic base of the present invention. Suitable physical development nuclei for use in accordance with the present invention are e.g. colloidal silver, heavy metal sulphides e.g. silver sulphide, nickel sulphide, palladium sulphide, cobalt sulphide, zinc sulphide, silver nickel sulphide etc. The layer of physical development nuclei may contain a hydrophilic binder but preferably does not contain a binder. The physical development nuclei contained in the image receiving layer can also be present partially or completely in the hydrophilic layer used in accordance with the present invention. A thus prepared element can be used as the image-receiving element in a DTR-process. According to this method an image-wise exposed photographic material comprising a silver halide emulsion layer is contacted with said image-receiving element and developed in the presence of a silver halide solvent e.g. thiosulphate or thiocyanate and one or more developing agents. Both elements are subsequently separated and a silver image is formed in the layer of physical development nuclei comprised on the image-receiving receiving element. More details about this process for obtaining a silver image in said receiving layer can be found in e.g. U.S. Pat. No. 4,649,096 or EP-A-397926. Said silver image is oleophilic while the background of the image-receiving element is oleophobic so that a lithographic printing plate results. It may however be advantageous to improve the oleophilicity of the silver image by treating the silver image with so-called hydrophobizing agents. U.S. Pat. No. 3,776,728 describes the use of heterocyclic mercapto-compounds, e.g. a 2-mercapto-1,3,4-oxadiazole derivative as hydrophobizing agents, U.S. Pat. No. 4,563,410 discloses hydrophobizing liquids containing one or more mercaptotriazole or mercaptotetrazole derivatives.

The following examples illustrate the invention without however limiting it thereto. All parts are by weight unless otherwise specified.

EXAMPLE 1

Preparation of the solution for the subbing layers.

To a solution of 11.4 g of gelatine (viscosity: 19–21 mPas) in 940 ml of water was added 31.7 ml(11.4 g solid product) KIESELSOL 300 F. (tradename for 30% aqueous dispersion of colloidal silica surface area of 300 $m^2$ per g). Anionic wetting agents ( 0.6 g ) and biocides (1 g ) were added.

Preparation of the hydrophilic layer.

To 440 g of a dispersion containing 21.5% $TiO_2$ (average particle size 0.3 to 0.5 um) and 2.5% polyvinyl alcohol in deionized water were subsequently added, while stirring, 250 g of a 5% polyvinyl alcohol solution in water, 105 g of a hydrolyzed 22% tetramethyl orthosilicate emulsion in water and 22 g of a 10% solution of a wetting agent. To this mixture was then added 183 g of deionized water and the pH was adjusted to pH=4.

Preparation of the lithographic base.

To a polyethylene terephthalate support, coated with a primer containing 170 $mg/m^2$ of a latex of copoly(-vinylidenechloride/methyl methacrylate/itaconic acid) and 40 $mg/m^2$ of silica with a surface area of 100 $m^2/g$ was applied the above described solution for the subbing layers at a solids content of respectively 750 $m^2/g$ and 375 $m^2/g$. On top of the subbing layers was coated the above mentioned hydrophilic layer to a wet coating thickness of 50 $g/m^2$, dried at 30° C. and subsequently hardened by subjecting it to a temperature of 60° C. for 1 week. The influence of the solids coverage on the scratch resistance and water absorption of a hydrophilic lithographic base is shown in table 1.

The scratch resistance, expressed in gram, was determined as follows:
immersing the material in demineralized water of 40° C. for 20 minutes,
blowing off the excessive amount of water present on top of the outermost layers,
placing the test strips in an apparatus containing three small balls with a diameter of 3.2 mm, the pressure on these balls is continuously increased while the strips are transported through the apparatus
first ball from 30 to 100 gram
second ball from 100 to 400 gram
third ball from 400 to 1600 gram
recording the weight whereby the layers are permanently scratched till on the support.

The amount of water absorption, expressed in $g/m^2$ was determined as follows:
preserving the dry film for 15 minutes in a conditioning room at 20° C. and 30% RH,
covering the backing topcoat layer of the dry film with a water impermeable tape,
weighing the dry film,
immersing the material in demineralized water of 24° C. for 10 minutes,
sucking up the excessive amount of water present on top of the outermost layers and
immediately determining the weight of the wet film and
calculating the measured weight differences between the wet and the dry film per square meter.

TABLE 1

| Number | Solids content (mg/m$^2$) | Scratch resistance (g) | Water absorption (g/m$^2$) |
|---|---|---|---|
| 1 | 750 | 190 | 2.93 |
| 2 | 375 | >1600 | 2.33 |

We claim:

1. A lithographic base comprising on a hydrophobic support a subbing layer contiguous to a hydrophilic layer containing a hydrophilic (co)polymer or (co)polymer mixture and being hardened with a hydrolysed tetraalkyl orthosilicate crosslinking agent characterized in that said subbing layer contains a hydrophilic binder and silica and is applied at a solids content of less than 750 mg per m$^2$.

2. A lithographic base according to claim 1 characterized in that said hydrophilic (co)polymer or (co)polymer mixture has a hydrophilicity which is the same as or higher than the hydrophilicity of polyvinyl acetate hydrolyzed to at least an extent of 60 percent by weight.

3. A lithographic base according to claim 1 characterized in that said hydrophilic (co)polymer is polyvinylalcohol and the tetraalkyl orthosilicate crosslinking agent is hydrolyzed tetraethyl or tetramethyl orthosilicate.

4. A lithographic base according to claim 1 characterized in that the hydrophobic support is an organic resin support or a polyolefin coated paper base.

5. A lithographic base according to claim 1 wherein the solids content is comprised between 250 mg per m² and 500 mg per m².

6. A lithographic base according to claim 1 wherein the subbing layer contains a hydrophilic binder and silica in a weight ratio less than 1.

7. A lithographic base according to claim 1 wherein in the the surface area of ths silica is at least 300 m² per gram.

8. A lithographic imaging element comprising on a lithographic base as defined in claim 1 or mixed with the hydrophilic layer of said base a heat- or photosensitive composition.

9. A lithographic imaging element according to claim 8 characterized in that the said light-sensitive composition contains a diazonium resin or a diazonium salt.

10. A lithographic receiving element comprising on a lithographic base as defined in claim 1 a layer of physical development nuclei.

* * * * *